United States Patent [19]

DeFrancesco et al.

[11] 3,938,184

[45] Feb. 10, 1976

[54] DIGITAL FLUTTER REDUCTION SYSTEM

[75] Inventors: Richard E. DeFrancesco, Holland, Pa.; Bernard Harris, Dobbs Ferry, N.Y.; David Hoffman, Hillsdale, N.J.

[73] Assignee: The United States of America as represented by the Secretary of the Navy, Washington, D.C.

[22] Filed: Mar. 21, 1975

[21] Appl. No.: 560,855

[52] U.S. Cl. .................... 360/51; 360/28

[51] Int. Cl.² .................... G11B 5/09

[58] Field of Search .................... 360/27, 28, 39, 51

[56] References Cited

UNITED STATES PATENTS

| | | | |
|---|---|---|---|
| 3,483,540 | 12/1969 | Damron | 360/27 |
| 3,725,609 | 4/1973 | Leboury | 360/28 |

*Primary Examiner*—Vincent P. Canney

*Attorney, Agent, or Firm*—R. S. Sciascia; Henry Hansen; W. J. Iseman

[57] ABSTRACT

A digital flutter reduction system which corrects for a varying time base error in FM recordings on magnetic tape. Pulse transitions from the outputs of a reference oscillator and a reference tone on a first tape track are compared by a flip-flop whose output is a pulse having a width corresponding to the time base error. The output pulse enables a first counter to provide a digital output which is loaded into a second counter. Pulse transitions from a second tape track containing recorded data advance the second counter over a number of counts indicative of a correction factor. The pulse transitions of the recorded data are delayed in accordance with the correction factor thereby reducing the time base error.

10 Claims, 5 Drawing Figures

DIGITAL FLUTTER REDUCTION SYSTEM

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to a means for reducing flutter in tape recording systems and particularly to an all digital device for reducing the time base error in magnetic tape recorders having data recorded by FM techniques.

The flutter that results from tape speed variations and the record/reproduce process in magnetic tape recording has historically been a problem. In using tape recorders for the storage and playback of pulse type data, variations in the recorder and playback speed result in spurious signals commonly known as flutter. The speed variations may be caused by tape slippage, mechanical vibrations, imperfect mechanical motion, changes in the dimension of the recording medium or variations in the speed of the recorder drive systems. Flutter is a relatively slow variation in the speed of the tape past the recording or the playback head. Because speed is one of the factors that determine the timing of the data signal to be reproduced, any variation in this speed will produce a variation in the reproduced signal.

In a typical FM tape recording system using a reference tone track for speed control, a highly stable tone is recorded on one track at the same time the data signal is recorded on a second track. The highly stable tone is provided by a reference oscillator. The reference tone is commonly used as a control signal in an electromechanical servo system to maintain a rotating type drive capstan at a constant speed during the recording process. Typically, a tachometer coupled to the recorder capstan provides the necessary feedback signal during recording. During the reproduction process a reference tone, which has the same characteristics as that used in recording, together with the output of the reference track is applied to a phase lock servo loop which attempts to control the tape speed so that the tone obtained from the reference track is a time replica of the original tone applied to the reference track during recording. Accordingly, if the servo technique were errorless the playback data signal would also be a time replica of the original signal. The instantaneous time base error (TBE) can readily be observed by taking a measurement during playback of the time difference between the zero crossings of the signal from the reference oscillator or tone generator and the signal obtained from the reference track. It has been observed in some reproducers running at a tape speed of 7.5 inches per second that time base errors of up to 2.5 microseconds ($\mu$sec.) and greater remain after correction by the electromechanical servo, depending upon the particular tape recorder being utilized.

Prior efforts to minimize such errors have included methods for keeping speed variations to a minimum by sophisticated electromechanical servo techniques with well designed and accurately machined tape transport mechanisms. A device for flutter reduction which utilizes hybrid circuitry composed of both analog and digital electronic circuits is disclosed in patent application Ser. NO. 512,835 by DeFrancesco et al. In analog circuits that are used for time base correction, the zero crossings of the data signal are advanced or delayed by having a voltage proportional to the TBE control the pulse width of a one-shot multivibrator or the "on time" of a triggered linear sweep circuit. In particular, the error correction portion of the hybrid device is entirely analog and which, accordingly, operates on varying quantities of ever changing voltages and currents. Such analog circuits lack stability due to the inherent drift of components and operating parameters.

SUMMARY OF THE INVENTION

Accordingly, it is an object of the present invention to provide an all digital deflutter device which is extremely stable in operation. Another object is to significantly reduce tape recorder time base error. One other object is to provide a device which will substantially reduce the amount of recoverable flutter in FM magnetic tape reproducing systems.

Briefly, these and other object are accomplished by a digital deflutter device for FM magnetic tape recorders which corrects for a varying time base error. Pulse transitions from the outputs of a reference oscillator and a reference tone on a first tape track are compared by a flip-flop whose output is a pulse having a width corresponding to the time base error. The output pulse enables a first counter to provide a digital output which is temporarily stored in a memory latch and subsequently loaded from the latch into a second counter. Pulse transitions from a second tape track containing recorded data are detected and advance a second counter over a number of counts indicative of a correction factor. The pulse transitions of the recorded data are delayed in accordance with the correction factor thereby reducing the time base error.

For a better understanding of these and other aspects of the invention, reference may be made to the following detailed description taken in conjunction with the accompanying drawings.

DESCRIPTION OF THE PREFERRED EMBODIMENT

Figure 1:
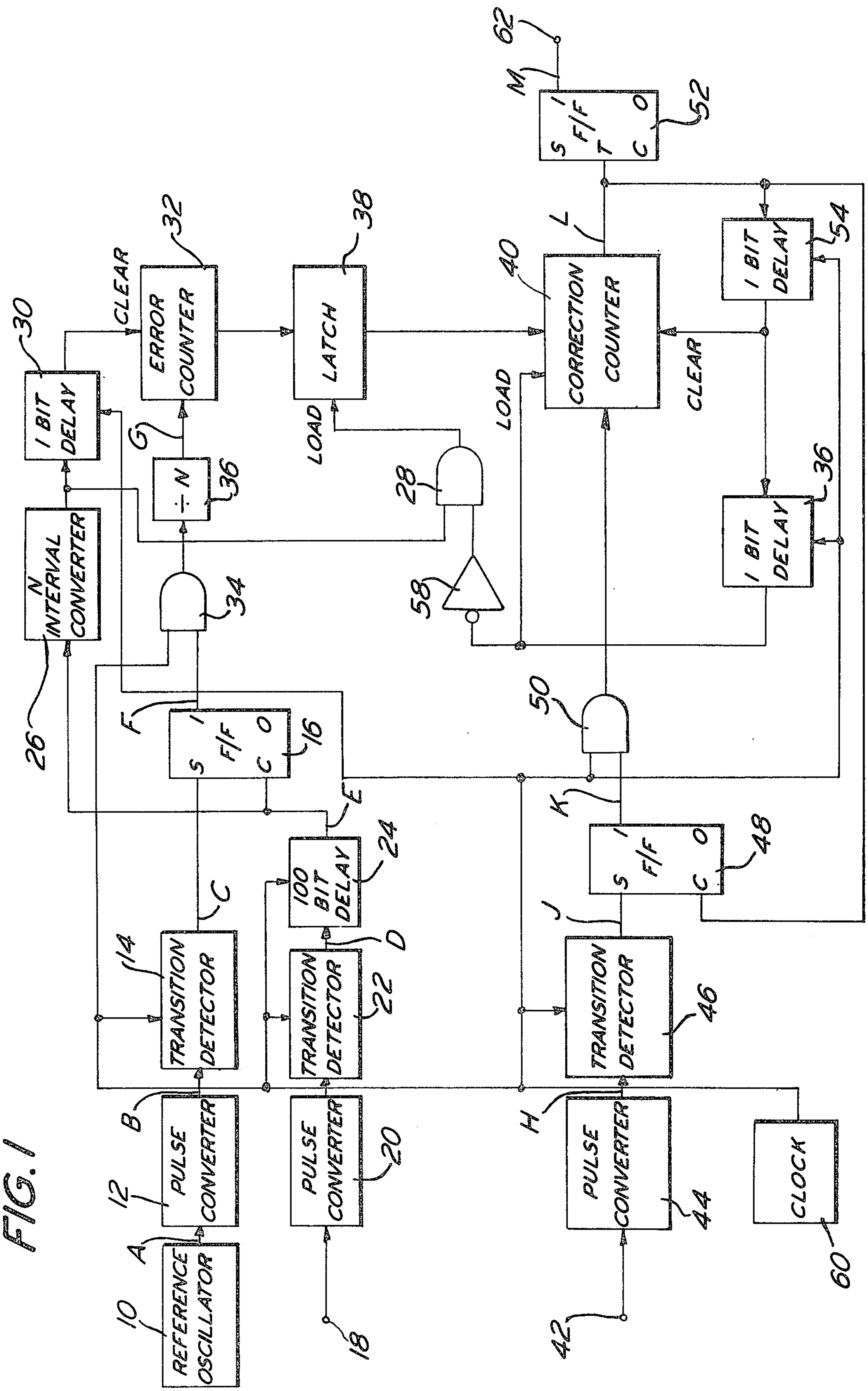
FIG. 1 is a block diagram of the present invention.

Referring now to FIG. 1, there is shown a block diagram of a digital time base error correcting device according to the present invention. A reference oscillator 10 is connected to provide an output to the input of a first pulse converter 12. The output of the converter 12 is connected to the data input of a first clocked transition detector 14 whose output is connected to the set input of a first flip-flop 16. A first input terminal 18 is adapted to receive a reference tone from a first tape track which is provided to the input of a second pulse converter 20 whose output is connected to the data input of a second clocked transition detector 22. The output of detector 22 is connected to the data input of a 100 bit delay 24 whose output is commonly connected to the clear input of flip-flop 16 and the input of an N interval counter 26. The output of counter 26 is commonly connected to one input of an AND gate 28 and a one bit delay 30 whose output is connected to the clear input of an error counter 32. The "one" output of flip-flop 16 is connected to one input of an AND gate 34 whose output is connected too the input of a N divider 36. Divider 36 provides an output to the clock input of counter 32 which provides eight parallel outputs to corresponding inputs of a latch 38 which further provides eight parallel outputs to corresponding inputs of a correction counter 40.

A second input terminal 42 is adapted to receive a data signal from a second tape track which is provided to the input of aa third pulse inverter 44 whose output is provided to the input of a third clocked transition detector 46. A second flip-flop 48 has its set input connected to receive the output from detector 46 and its one output connected to one input of an AND gate 50. The output of gate 50 is connected to the clock input of counter 40. Counter 40 provides a single output which when activated is indicative of a maximum predetermined count having occurred and which output is commonly connected to the toggle input of a third flip-flop 52, the input of a one bit delay 54, and the clear input to flip-flop 48. Delay 54 provides an output which is commonly connected to the clear input of counter 40 and the input of another one bit delay 56. Delay 56 provides an output to the input of an inverter 58 whose output is connected to the other input of gate 28 which provides an output connected to the load input of the latch 38. A master oscillator or clock 60 generates an output which is commonly connected to each of the transition detectors 14, 22, 46, the other inputs of gates 34, 50 and the clock inputs to delays 24, 30, 54, 56. The one output of the flip-flop 52 is connected to an output terminal 62.

Figure 2:
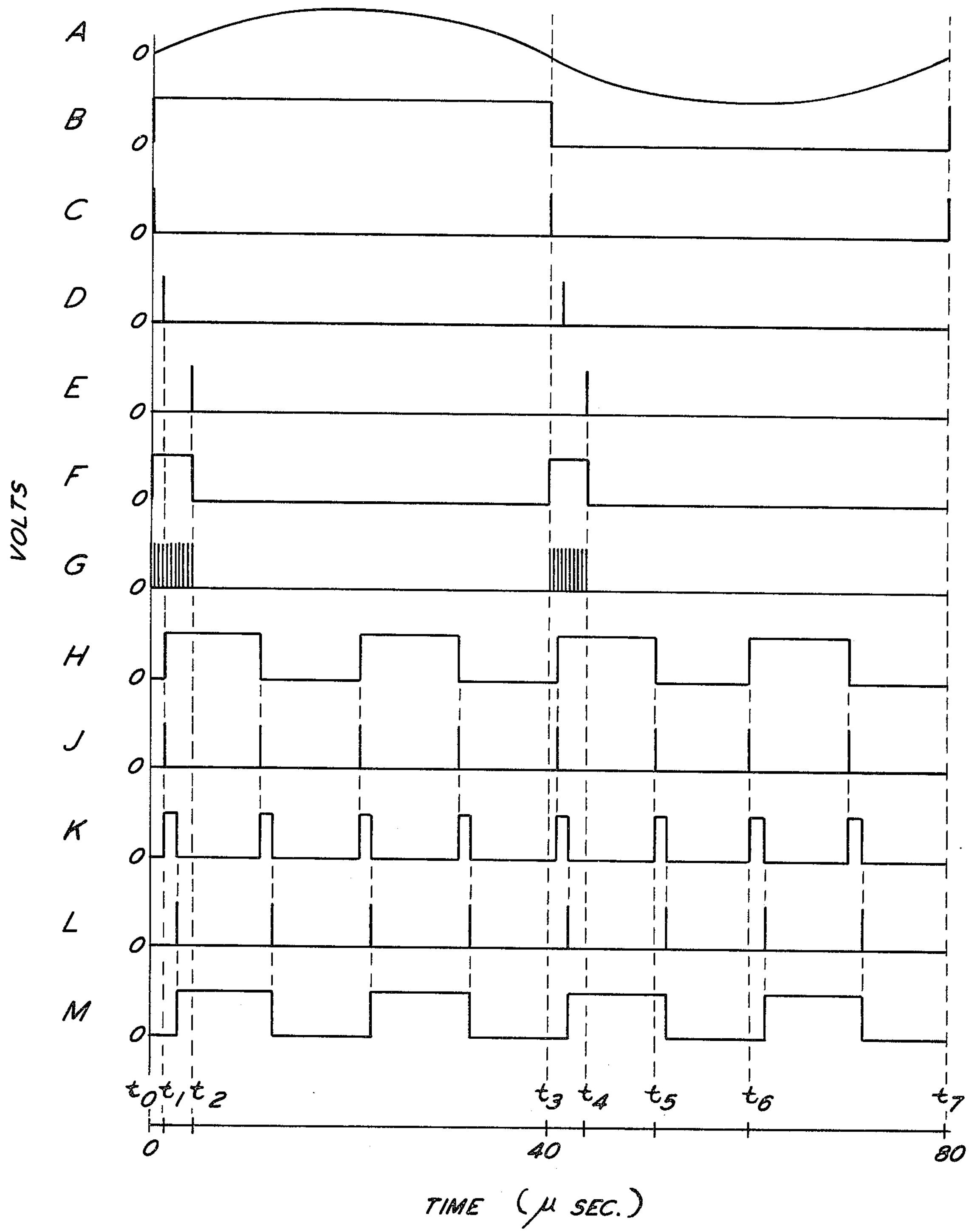
FIG. 2 is a diagram of signal wave forms generated by the invention shown in FIG. 1.

Referring now to FIG. 2, in conjunction with FIG. 1, there are shown various examples of signal waveforms that are generated at different points within the invention. In order to better explain the present invention and give a specific example of its operation, particular structural elements of the invention shown in FIG. 1 will be assigned specific operating parameters. For example, the reference oscillator 10 is assumed to be operating at a frequency of 12.5 KHz. Similarly, the input terminal 18 is adapted to receive a prerecorded reference tone of an average frequency of 12.5 Khz. The reference tone, which is produced by a reference oscillator such as oscillator 10, is recorded upon one track of magnetic tape during the recording process. The input terminal 42 is adapted to receive an FM data signal having a carrier frequency, for example, of 50 Khz. The FM data signal is recorded on a second track of the same tape which is used to record the reference tone. Both of the signals on input terminals 18 and 42 are assumed to be of a sinusoidal or AC varying type waveform with the positive and negative excursions of the waveforms always crossing a threshold or zero level amplitude. The data being recorded may be representative, for example, of acoustic signals gathered by hydrophones that are sensing the signatures of submarines. The clock 60 is assumed to be operating at a frequency, for example, of 40 Mhz.

The reference oscillator 10 provides a 12.5 Khz output signal as shown in waveform A, FIG. 2, Waveform A is sinusoidal having a period of 80 μsec. and which crosses a zero or threshold level at $t_o$, $t_3$, and $t_7$. The first pulse converter 12 which may be, for example, a Schmitt trigger receives the output signal from oscillator 10 and produces a signal as shown in waveform B in FIG. 2. Waveform B illustrates a squared off pulse having a period of 80 μsec. with pulse transitions coincident with the zero crossings of the oscillator output shown in waveform A. The signal shown in waveform B is clamped to a positive polarity by the converter 12. The first clocked transition detector 14 which will be described with further detail hereinafter receives the converter 12 output shown in waveform B and produces an output signal as shown in waveform C. The purpose of the transition detector 14 is to receive an asyncronous signal such as formed at the output of the converter 12 and to provide a series of output pulses as shown in waveform C which coincide as near in time occurrence as possible with the zero crossings or pulse transitions of the asyncronous signal. Since the detector 14 is a clocked device the output pulse as shown in waveform C is one clock pulse wide and will coincide in time with the occurrence of an input clock pulse provided by the clock 60 and which, within the resolution of the clocking frequency, will occur as close in time as possible to the occurrence of the asyncronous signal zero crossings.

Input terminal 18 is adapted to receive the 12.5 Khz reference tone from the output of the first track of the magnetic tape and connects the reference tone to the input of the second pulse converter 20. Pulse converter 20 converts the bipolar zero crossings of the incoming sinusoidal reference tone into a unipolar output signal similar to that shown in waveform B and which signal is processed through the second transition detector 22 to produce an output signal such as shown in waveform D wherein the pulse durations are 25 nanoseconds wide. Waveform D illustrates a series of 2 pulses which coincide with the zero crossings of the tone on the reference track. Accordingly, it will be seen that the first pulse at $t_1$ in waveform D lags the first pulse at $t_o$ in waveform C by approximately 1.5 μsec. Similarly, the second pulse in waveform D lags the second pulse at $t_3$ in waveform C by approximately 1.4 μsec. Only the lagging TBE case is illustrated in this example since the leading TBE case is similarly processed. The 100 bit delay 24 receives the output signal from the detector 22 and produces an output signal as shown in waveform E which is a replica of the input signal but delayed in time a fixed period of 100 clock pulses or 2.5 μsec. In the present example, it is assumed that the maximum leading or lagging TBE is 2.5 μsec. Obviously, the amount of error will vary with the recording system being utilized and the period of delay 24 is utilized to eliminate the necessity of processing both leading and a lagging TBE. That is, if the delay 24 period is set to 2.5 μsec. as in the present example, any tone zero crossings that produce a leading time base error will be delayed so as to remove the time lead entirely and provide either an in-phase or a lagging time reference to the zero crossings of the reference oscillator 10. Similarly, any reference tones that produce time lag zero crossings with reference to the zero crossings of oscillator 10 will only be further delayed 2.5 μsec. with a resultant maximum delay of 5.0 μsec.

The first flip-flop 16 has its set input connected to receive the output from transition detector 14 and its reset or clear input connected to receive the output from delay 24. Accordingly, the one output from the flip-flop 16 provides an output pulse as shown in waveform F whose positive going edge is set by the first pulse at $t_o$ in waveform C and its negative going edge is set by the first pulse at $t_2$ shown in waveform E. Thus the width of the pulse $t_o$–$t_2$ is 4.0 μsec. as shown in waveform E and is indicative of the time base error between the zero crossings of the reference oscillator and the zero crossings of the reference tone on the tape track. In the case of the second pulse shown in waveform C at $t_3$, the corresponding pulse beginning at $t_3$ in waveform F is 3.9 μsec. wide.

The AND gate 34 has its first input connected to receive the output of the flip-flop 16 shown in waveform F and a second input connected to receive the output from the clock 60. The output from the AND gate 34 is connected to the input of the divider 36 which, in conjunction with the counter 26, forms an averaging network that smooths out the error indication in the error counter 32. That is, counter 32 is designed to provide a digital count indicative of the time base error of the incoming signal taken over a series of N reference oscillator pulses or intervals to thus provide a better estimate of the slowly varying time base error. In the present example, the number of oscillator pulse intervals N is selected to be ten although larger or smaller values may obviously be utilized. Accordingly, the divider 36 provides a divide by ten function which produces an output such as shown in waveform G having a series of clock pulses within the corresponding pulse width duration shown in waveform F and which clock pulses are one tenth the normal number that would be present during the respective pulse durations shown in waveform F. The output of the divider 36 is connected to the clock input of the counter 32 and passes clock signals produced by the oscillator 10 to the counter according to the duration of the flip-flop output pulse shown in waveform F. Accordingly, the counter 32 is permitted to count to an integer which proportional to the duration of the pulse widths shown in waveform F. In this particular example, the maximum width of the pulse produced by the output of flip-flop 16 is 5.0 μsec. Accordingly, the count for the counter 32 which is clocked at a 40 Mhz rate and representative of a 5.0 μsec. pulse is 200. Therefore, the number of stages required by the counter 32 programmed in, for example, a binary format is eight. In order to insure that the counter 32 always starts from a zero count and that the counter only increments over a series of N=10 reference oscillator pulse intervals, the N interval counter 26 is connected to receive the output pulses from the delay 24 and, after counting 10 such pulses, provides an output signal to the input of the one bit delay 30 which provides an output pulse to the clear input of the counter 32. The delay 30 is interposed between the N interval counter 26 and the error counter 32 in order to insure that the counter 32 has received all pertinent clock pulses before it is cleared. Accordingly, since the pulse width $t_o$–$t_2$ in waveform F is 4.0 μsec., the gate 34 passes a series of 160 clock pulses to the input of the divider 36 which causes the error counter 32 to increment by 16 counts. It should be noted that the counting capacity of counter 32 maybe increased or decreased to represent various degrees of time base error and, as in the present case with a possible maximum lagging time base error of 2.5 μsec., the corresponding error count is 200. Correspondingly, with a zero time base error, the error count would be 100 and with a possible maximum leading time base error of 2.5 μsec. the error count would be zero. The second pulse beginning at $t_3$ in waveform F is 3.9 μsec. wide and permits the gate 34 to pass 156 pulses from the clock 60. Accordingly, after passing through the divider 36 which preferably rounds off the number of output pulses the error counter 32 is incremented from the previous count by 15. Assuming that the termination of the second pulse in waveform F signals the end of N=10 intervals and that the average of the time base error over those 10 intervals if 1.4 μsec., the error counter 32 provides at its outputs a digital count of 156. AND gate 28 is connected at one input to receive the pulse output from the interval counter 26 and provides a corresponding output pulse to the load input of the latch 38 due to the normally high active state of the gate 28 second input. Accordingly, the latch 38 receives the error count from the count 32 immediately at the end of N intervals and stores the digital count therein.

The input terminal 42 is adapted to receive the data signal which is recorded on the second track of the same tape on which the reference tone is recorded. Accordingly, a converted pulse date signal is shown in waveform H of FIG. 2 and, in this example, is representative of an unmodulated FM carrier of 50 Khz, having a corresponding period of 20 μsec. Assuming a minimal amount of mechanical eccentricity during the recording process, it is presumed that the FM data signal will have either a time lead or time lag corresponding to the lead or lag indicated by the reference tone on the first tape track. Waveform H illustrates a series of pulses having transitions at substantially equal periods of 10 μsec. for all positive and negative going pulses except the negative going pulse $t_5$–$t_6$ which has a period of 9.9 μsec. This exemplary time difference in the period of the pulse transitions is indicative of the flutter phenomenon and which will continually vary along the recording tape. The third clocked transition detector 46 receives the inverted data signal from the counter 44 as shown in waveform H and produces an output signal as shown in waveform J wherein the pulse transitions which are indicative of the zero crossings of the input data signal at the terminal 42 are noted by the production of a series of pulses each being one clock pulse wide. The second flip-flop 48 has a set input which receives the output from the detector 46 and which provides at its one output a signal as shown in waveform K. AND gate 50 receives the output signal from flip-flop 48 and permits clock pulses from the clock 60 to pass through the gate 50 for the duration of each of the pulses shown in waveform K. The clock pulses which pass through the AND gate 50 cause the correction counter 40 to increment upwards from the count which is loaded into the counter 40 from the latch 48. Assuming that the processing of the prior N=10 intervals by the error counter 32 produced an output count of 160, the latch 38 had parallely loaded the number 160 into the correction counter upon the prior application of a load pulse to the counter 40. Coincident with the activation of the foregoing load pulse, inverter 58 provides a low output signal to the second input of the AND gate 28 to prevent the occurrence of loading a new number into the latch 38 while the counter 40 is receiving the error count from the latch 38. The correction counter 40 is designed to provide a maximum count of 200 and, at achieving this count, a pulse output is produced as shown in waveform L. The maximum count of the counter 40 is determined from the frequency of the clock 60 and the maximum period over which time base error is to be processed. In the present example, it takes 200 counts at a clocking frequency of 40 Mhz. to cover a maximum counting time of 5.0 μsec. Therefore, with the prior loading of the number 160 into the counter 40, there will be a further count of 40 clock pulses until the maximum count of 200 is achieved. With each occurrence of the maximum count, a respective one in the series of pulses as shown in waveform L is provided at the output of the counter 40 to the clear input of the second flip-flop 48 so as to return the formerly high output of the flip-flop as shown in waveform K to the zero level and thereby inhibit further action by the gate 50. The counter 40 is cleared one clock pulse period after the occurrence of the maximum count by a pulse produced at the output of the delay 54 and, after one further clock period, the load pulse is produced at the output of the delay 56. The positive pulses shown in waveform K are sequentially produced by the occurrence of a pulse shown in waveform J and continue for a pulse duration equal to the time period necessary for the correction counter 40 to increment to the maximum count at which time there is a termination effected by the production of the output pulses shown in waveform L. In the first six positive going pulses shown in waveform J, the pulse durations are each one μsec wide and are representative of the correction counter having counted 40 clock pulses. As noted earlier, the end of the second pulse in waveform F signals the termination of processing for the previous N=10 intervals. For the present N=10 intervals ending with the tenth interval at $t_4$, the error counter 32 increments to a count of 156 indicative of an average lagging time base error of 1.4 μsec. The latch 38 loads the number 156 into the correction counter 40 two clock periods after the occurrence of the pulse shown in waveform L during $t_5$–$t_6$. Accordingly, instead of requiring 40 additional pulses to achieve the maximum count of 200 as was required by the previous N intervals, the counter 40 will now be required to count a total of 44 clock pulses to achieve the same maximum count. A new time of 1.1 μsec. is now required for the counter 40 to count to its maximum value. Waveform K illustrates the wider pulse width of 1.1 μsec. beginning at $t_6$ with the seventh positive pulse in the waveform series. Flip-flop 52 has its toggle input connected to receive the output signal from the correction counter 40 and produces a series of regularly spaced pulses at the output terminal 62 each having a width of 10 μsec. as shown in waveform M. The output signal shown in waveform M is generated at the output terminal 62 and represents a replica of the data signal which has been modified by the time base error correction as taught by the present invention. The flutter irregularity shown in waveform H as a shortened pulse width of 9.9 μsec. is now removed due to the increased pulse delay in waveform K beginning at $t_6$. The delay of the output signal shown in waveform M as referenced to the input signal shown in waveform H is of no serious consequence because the tape recording system is essentially a storage device and not intended for real time use. Moreover, the sense of the output data at terminal 62 is of no serious consequence inasmuch as it is the zero crossings of the data signal that gives significance to the recorded data.

In the foregoing example, the irregularity in the input data shown in waveform H has been illustrated as being sequentially followed by a modified pulse at $t_6$ in waveform K. This sequence is more nearly indicative of the operation of the present invention without having averaged the correction factor. That is, the correction of a TBE will immediately follow the presence of an irregular data pulse. With the averaging feature utilized, however, the data irregularity and the correction factor will most likely not be in sequence inasmuch as the correction factor is used to modify all of the N intervals and one or more data irregularities may occur anywhere within the N intervals.

Figure 3:
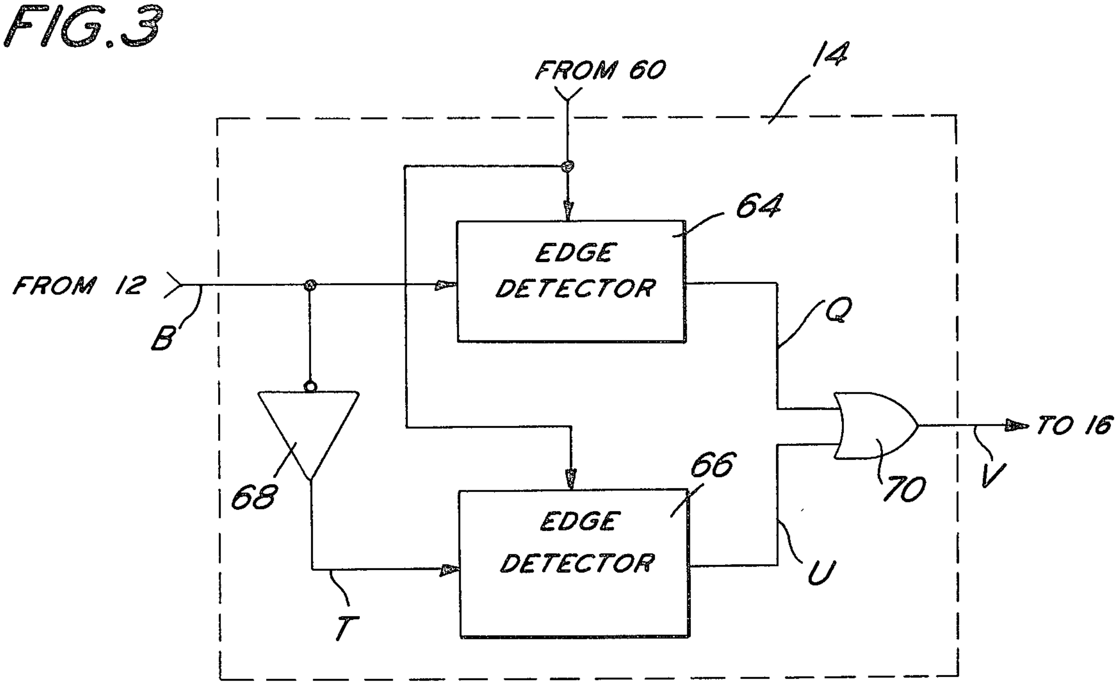
FIG. 3 is a block diagram of a clocked transition detector utilized in the invention of FIG. 1.
Figure 4:
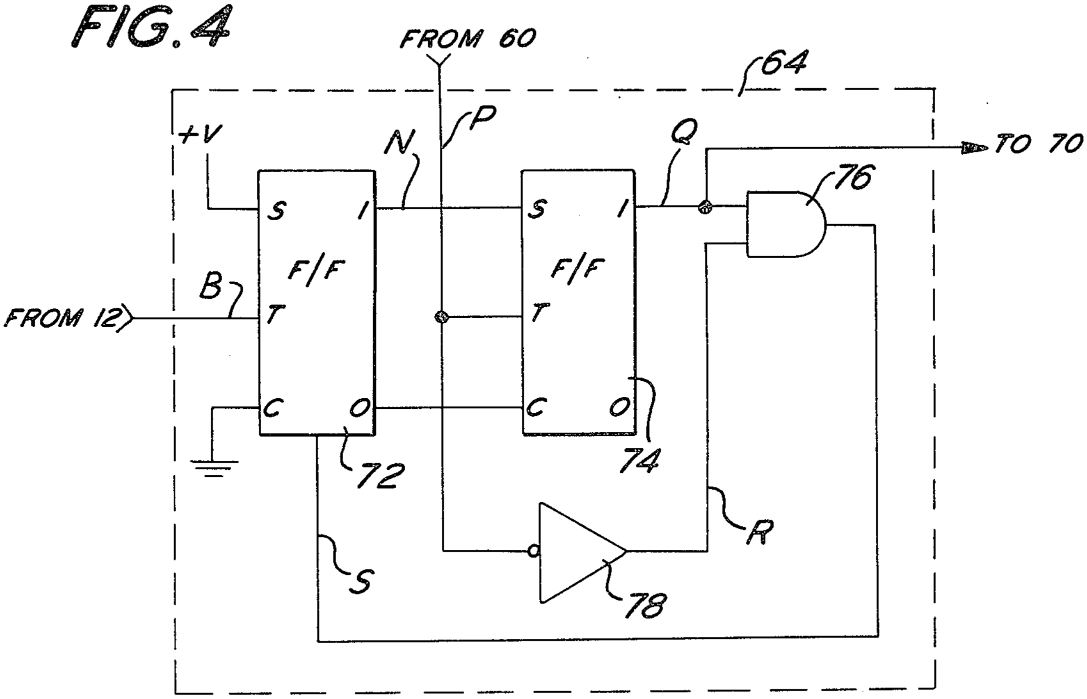
FIG. 4 is a logic diagram of an edge detector utilized in the transition detector shown in FIG. 3.
Figure 5:
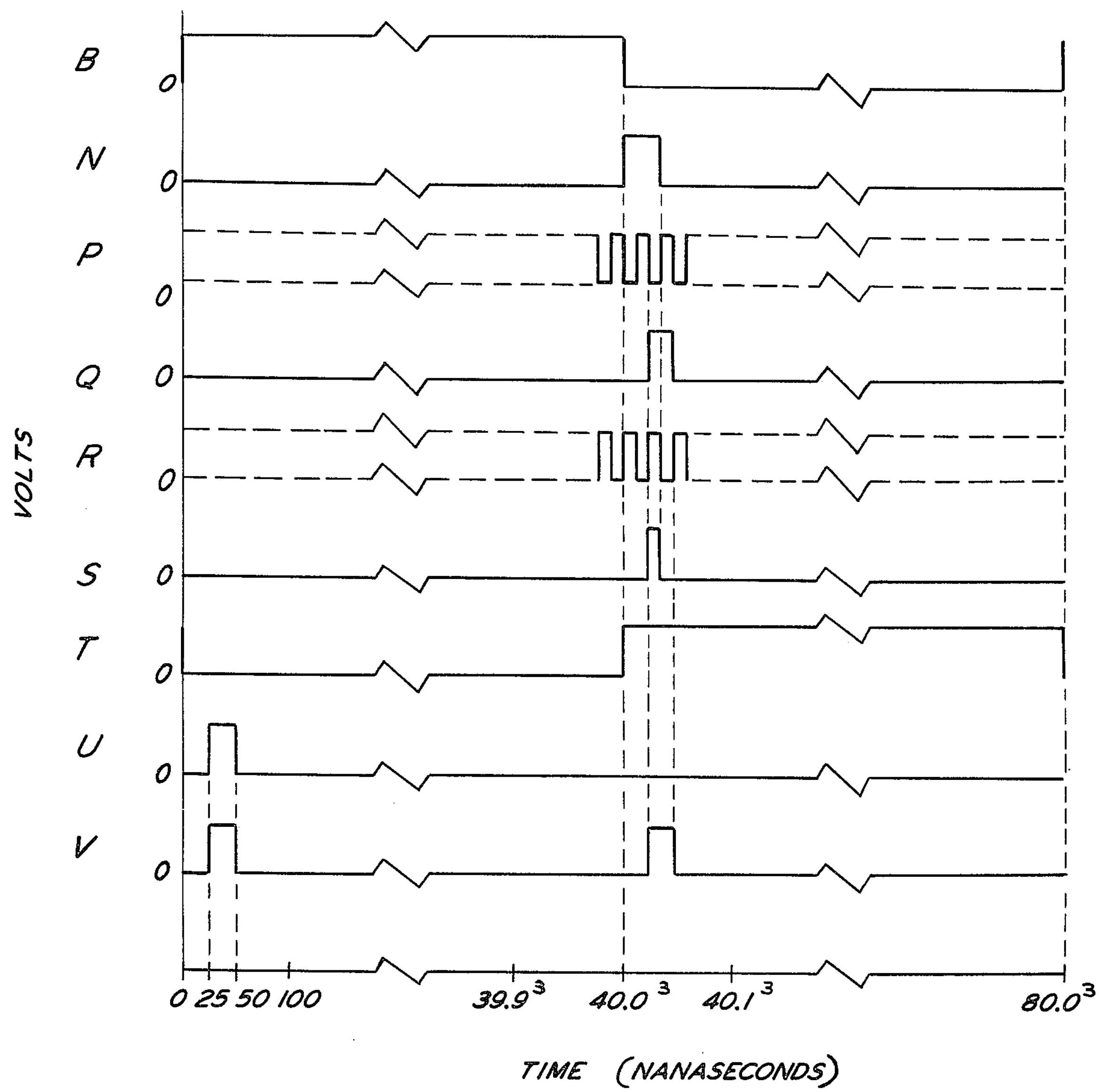
FIG. 5 is a diagram of signal waveforms generated by the edge detector shown in FIG. 4.

Referring now to FIGS. 3 and 4 in conjunction with FIG. 5 the operation of the clocked transition detector 14 will now be explained. The operation of detectors 22 and 46 is identical to that of detector 14. As earlier mentioned, the purpose of the clocked transition detector is to detect the pulse transitions of an asynchronous source and to provide a synchronous output signal as close in time as possible to the occurrence of the asynchronous pulse transition. In the present invention the asynchronous signal sources are represented by the outputs from the pulse converters 12, 20, 44. FIG. 3 illustrates a block diagram of the detector 14 wherein a first edge detector 64 has a first input connected to receive the output from the converter 12 and a second input connected to the output of the clock 60. A second edge detector 66 has a first input operatively connected to receive the output from converter 12 through an inverter 68 and has a second input connected to receive the signal from the clock 60. The respective outputs of the detectors 64, 66 are connected to the inputs of an OR gate 70 whose output is provided to the set input of the flip-flop 16. Each of the clocked edge detectors 64, 66 is designed to detect the negative going edge of the incoming signal and to provide an output signal that is one clock period wide upon the occurrence of the incoming negative going edge.

After conversion by the pulse converters 12, 20, 44, the incoming pulse signals such as shown in waveform B are converted to a series of positive polarity pulses. Since each of the edge detectors 64, 66 operates only on the negative going edge of the input signal such as shown in waveform B, the inverter 68 is placed between the input to the first edge detector 64 and provides a phase reversed output such as shown in waveform T to the input of the second edge detector 66. Waveform Q shows the signal output from the first edge detector as a one clock period wide pulse generated shortly after the time occurrence of the negative going edge in waveform B. Waveform U illustrates the output signal from the second edge detector 66 having a one clock period wide pulse generated shortly after the positive going edge of the signal shown in waveform B. OR gate 70 combines both of the incoming waveforms Q and U into a single output signal shown in waveform V having a series of pulses each one clock period wide and indicative of the positive and negative pulse transitions shown in waveform B.

Referring now to FIG. 4, there is shown a logic diagram of the first edge detector shown as 64 in FIG. 3. The second edge detector 66 shown in FIG. 3 is identical in operation of that of the first detector. A first flip-flop 72 such as, for example, a JK Master/Slave device is connected to receive an input signal on its toggle input. The set input of the flip-flop 72 is connected to receive a positive bias voltage having a level equivalent to the active high state of the logic being utilized and the clear input of the flip-flop 72 is connected to ground thereby providing, respectively, a one input to the set side of the flip-flop and a zero input to the clear side. The one output of the flip-flop 72 is connected to the set input of a second flip-flop 74 which may also be, for example, a JK Master/Slave device. The zero output of flip-flop 72 is also connected to the clear input of flip-flop 74. The one input from flip-flop 72 is shown in waveform N and generates a pulse beginning substantially at the time of the negative going edge of the input signal shown in waveform B and continues for a time period that is approximately 0.5 to 1.5 clock periods wide depending upon the detector operating parameters. The toggle input of the flip-flop 74 is connected to receive clock pulses from the clock 60 as shown in waveform P wherein each clock period is 25 nanoseconds. The clock pulses are also connected to the input of the inverter 78 which provides an inverted output to one input of an AND gate 76. Upon receipt of the input signal shown in waveform N on the set input to flip-flop 74, an output pulse is produced as shown in waveform Q having a duration of one clock period and which begins with the negative going edge of the clock pulse that occurs one clock period after the beginning of the pulse shown in waveform N. The output signal of flip-flop 74 shown in waveform Q forms the output from the clocked edge detector 64 and which is connected to one input of OR gate 70 shown in FIG. 3. The inverter 78 inverts the incoming clock pulse shown in waveform P to produce a series of output clock pulses as shown in waveform R. Upon the simultaneous occurrence of a high signal input from waveform Q and a high clock pulse shown in waveform R, the gate 76 produces an output pulse shown in waveform S which is one half a clock period wide and which is connected to the external clear input on flip-flop 72. The negative going edge of the signal shown in waveform S forces flip-flop 72 to provide a zero level at the one output as shown by the negative going edge of the pulse shown in waveform N. Thus, the clocked edge detector 64 operates to provide an output pulse signal one clock period wide which is generated at a time beginning with the negative pulse transition shown in waveform B.

Thus it may be seen that there has been provided a novel device for reducing flutter in FM magnetic tape recording systems by appropriately varying the zero crossings of data signal and playback according to the amount of time base error within the recording system.

Obviously, many modifications and variations of the invention are possible in light of the above teachings. It is therefore to be understood that within the scope of the appended claims the invention may be practiced otherwise than as specifically described.

What is claimed is:

1. A digital time base error correcting system for FM tape recorders having a reference tone on a first tape track and data signals on a second tape track comprising, in combination:

timing means for generating a series of clock pulses;

first pulse generating means connected to receive said clock pulses for producing a series of periodic output pulses having a frequency equal to the average frequency value of said reference tone;

second pulse generating means adapted to receive said reference tone and connected to receive said clock pulses for producing a series of output pulses indicative of the zero crossings of said tone;

delay means connected to receive said clock pulses and said second generating means output pulses for producing a time delayed replica output thereof;

pulse width encoding means connected to receive said first pulse generating means output signals and said delay means output for producing an output pulse having a variable width depending upon the time separation between corresponding ones of said first pulse generating means output signals and the delay means output pulses;

first counting means connected to receive said pulse width encoding means output pulse and said clock pulses for producing a digital count indicative of the width of said pulse width encoding means output pulse;

third pulse generating means adapted to receive said data signals and connected to receive said clock pulses for producing a series of output pulses indicative of the zero crossings of said data signals;

second counting means connected to receive said first counting means digital count and said clock pulses for counting from said digital count to a predetermined count upon the receipt of individual ones of said third pulse generating means output pulses and for producing an output pulse indicative of the occurrence of said predetermined count; and fourth pulse generating means connected to receive said second counting means output pulse for producing a series of output pulses having respective widths corresponding to the sequential time occurrence of said second counting means output pulse;

whereby said fourth pulse generating means output pulses are indicative of the data signals corrected for time base error.

2. A time base error correcting system as set forth in claim 1 wherein said first counting means further comprises:

first gating means connected to receive said clock pulses and said pulse width encoding means output pulse for passing said clock pulses during the receipt of said pulse width encoding means output pulse and providing an output thereof;

a first counter operatively connected to receive said gating means output for counting the number of pulses therein and for producing an output indicative thereof; and storage means operatively connected to receive said second counting means output pulse and connected to receive said first counter output for storing said counter output upon the receipt of said second counting means output pulse and for producing said digital count.

3. A time base error correcting system as set forth in claim 2 wherein said second counting means further comprises:

switching means connected to receive said third pulse generating means output pulses and said second counting means output pulse for producing an output pulse which begins with the receipt of an individual one of said third pulse generating means output pulses and terminates with the receipt of said second counting means output pulse;

second gating means connected to receive said switching means output pulse and said clock pulses for passing said clock pulses during the receipt of said switching means output pulse and providing an output thereof; and a second counter connected to receive said second gating means output and said digital count for counting from said digital count to said predetermined count and for providing the second counting means output pulse.

4. A time base error correcting system as set forth in claim 3 wherein said pulse width encoding means is a flip-flop having a set input connected to receive said first pulse generating means output pulses, a clear input connected to receive said delay means output, and an output for producing the output pulse.

5. A time base error correcting system as set forth in claim 4 wherein said switching means is a flip-flop having a set input connected to receive said third pulse generating means output pulses, a clear input connected to receive said second counting means output pulse, and an output for producing the output pulse.

6. A digital time base error correcting system for FM tape recorders having a reference tone on a first tape track and data signals on a second tape track comprising, in combination:

timing means for generating a series of clock pulse;

first pulse generating means connected to receive said clock pulses for producing a series of periodic output pulses having a frequency equal to the average frequency value of said reference tone;

second pulse generating means adapted to receive said reference tone and connected to receive said clock pulses for producing a series of output pulses indicative of the zero crossings of said tone;

delay means connected to receive said clock pulses and said second generating means output pulses for producing a time delayed replica output thereof;

pulse width encoding means connected to receive said first pulse generating means output signals and said delay means output for producing an output pulse having a variable width depending upon the time separation between corresponding ones of said first pulse generating means output signals and the delay means output pulses;

first gating means connected to receive said clock pulses and said pulse width encoding means output pulse for passing said clock pulses during the receipt of said pulse width encoding means output pulse and providing an output thereof;

averaging means connected to receive said delay means output and said first gating means output for producing a first output indicative of the occurrence of a first predetermined number of said delay means outputs and a second output indicative of said first gating means output pulses divided by said first predetermined number;

first counting means operatively connected to receive said averaging means first output and connected to receive said averaging means second output for incrementally summing the number of pulses at said averaging means second output upon the receipt of said averaging means first output and for producing a digital count indicative of the sum of said averaging means second output pulses;

third pulse generating means adapted to receive said data signals and connected to receive said clock pulses for producing a series of output pulses indicative of the zero crossings of said data signals;

second counting means connected to receive said first counting means digital count and said clock pulses for counting from said digital count to a second predetermined count upon the receipt of individual ones of said third pulse generating means output pulses and for producing an output pulse indicative of the occurrence of said second predetermined count; and fourth pulse generating means connected to receive and second counting means output pulse for producing a series of output pulses having respective widths corresponding to the sequential time occurrence of said second counting means output pulse;

whereby said fourth pulse generating means output pulses are indicative of the data signals corrected for time base error.

7. A time base error correcting system as set forth in claim 6 wherein said first counting means further comprises:

a first counter having a clear input operatively connected to receive said averaging means first output and a clock input connected to receive said averaging means second output for summing the number of pulses in said averaging means output upon the receipt of said averaging means first output and for producing an output sum; and storage means operatively connected to receive said second counting means output pulse and connected to receive said first counter output sum for storing said sum upon the receipt of said second counting means output pulse and for producing said digital count.

8. A time base error correcting system as set forth in claim 7 wherein said second counting means further comprises:

switching means connected to receive said third pulse generating means output pulses and said second counting means output pulse for producing an output pulse which begins with the receipt of an individual one of said third pulse generating means output pulses and terminates with the receipt of said second counting means output pulse;

second gating means connected to receive said switching means output pulse and said clock pulses for passing said clock pulses during the receipt of said switching means output pulse and providing an output thereof; and a second counter connected to receive said second gating means output and said digital count for counting from said digital count to said second predetermined count and for providing the second counting means output pulse.

9. A time base error correcting system as set forth in claim 8 wherein said pulse width encoding means is a flip-flop having a set input connected to receive said first pulse generating means output pulses, a clear input connected to receive said delay means output, and an output for producing the output pulse.

10. A time base error correcting system as set forth in claim 9 wherein said switching means is a flip-flop having a set input connected to receive said third pulse generating means output pulses, a clear input connected to receive said second counting means output pulse, and an output for producing the output pulse.

* * * * *

UNITED STATES PATENT AND TRADEMARK OFFICE

CERTIFICATE OF CORRECTION

PATENT NO. : 3,938,184

DATED : February 10, 1976

INVENTOR(S) : Richard E. DeFrancesco et al

It is certified that error appears in the above–identified patent and that said Letters Patent are hereby corrected as shown below:

Column 12, line 21, after "means" insert --second-- .

Signed and Sealed this

Fourteenth Day of September 197(

[SEAL]

*Attest:*

RUTH C. MASON
*Attesting Officer*

C. MARSHALL DANN
*Commissioner of Patents and Trademarks*